(12) United States Patent
Jung

(10) Patent No.: US 12,243,798 B2
(45) Date of Patent: Mar. 4, 2025

(54) SEMICONDUCTOR DEVICE AND METHOD OF FABRICATING THE SAME

(71) Applicant: Samsung Electronics Co., Ltd., Suwon-si (KR)

(72) Inventor: Jae-Min Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 248 days.

(21) Appl. No.: 17/729,734

(22) Filed: Apr. 26, 2022

(65) Prior Publication Data
US 2023/0080328 A1 Mar. 16, 2023

(30) Foreign Application Priority Data
Sep. 16, 2021 (KR) .................. 10-2021-0123590

(51) Int. Cl.
*H01L 23/367* (2006.01)
*H01L 21/48* (2006.01)
*H01L 23/31* (2006.01)
*H01L 23/36* (2006.01)

(52) U.S. Cl.
CPC ...... *H01L 23/3675* (2013.01); *H01L 21/4882* (2013.01); *H01L 23/3164* (2013.01); *H01L 23/36* (2013.01)

(58) Field of Classification Search
CPC ............. H01L 23/3675; H01L 21/4882; H01L 23/3121; H01L 23/562; H01L 23/3735; H01L 23/3736; H01L 23/552; H01L 24/00; H01L 23/36; H01L 23/3164
See application file for complete search history.

(56) References Cited

U.S. PATENT DOCUMENTS

| | | | |
|---|---|---|---|
| 6,861,750 B2 | 3/2005 | Zhao et al. | |
| 7,911,050 B2 | 3/2011 | Nakajima | |
| 8,575,746 B2 | 11/2013 | Lee et al. | |
| 10,770,368 B2 | 9/2020 | Huang et al. | |
| 2008/0291652 A1* | 11/2008 | Shin | H01L 23/3128 361/783 |
| 2017/0162487 A1* | 6/2017 | Huang | H01L 23/3164 |

FOREIGN PATENT DOCUMENTS

| | | |
|---|---|---|
| KR | 1020110042441 A | 4/2011 |
| KR | 101183184 B1 | 9/2012 |
| KR | 10-2021-0065019 A | 6/2021 |

* cited by examiner

*Primary Examiner* — Patricia D Valenzuela
(74) *Attorney, Agent, or Firm* — Muir Patent Law, PLLC

(57) ABSTRACT

Disclosed are semiconductor packages and their fabrication methods. The semiconductor package comprises a circuit substrate, a semiconductor chip mounted on the circuit substrate, and a thermal radiation film covering the semiconductor chip on the circuit substrate. The semiconductor chip includes first lateral surfaces opposite to each other in a first direction and second lateral surfaces opposite to each other in a second direction that intersects the first direction. A first width of the first lateral surface is less than a second width of the second lateral surface. The thermal radiation film covers a top surface of the semiconductor chip and entirely surrounds the first and second lateral surfaces of the semiconductor chip. The thermal radiation film has slits directed toward the first lateral surfaces from ends of the thermal radiation film.

20 Claims, 16 Drawing Sheets

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0123590, filed on Sep. 16, 2021, in the Korean Intellectual Property Office, the disclosure of which is hereby incorporated by reference in its entirety.

TECHNICAL FIELD

The present inventive concepts relate to a semiconductor package and a method of fabricating the same, and more particularly, to a chip-on-film type semiconductor package and a method of fabricating the same.

DISCUSSION OF RELATED ART

In the semiconductor industry, integrated circuit packaging technology has been developed to satisfy requirements for small-form-factor devices and high package reliability. For instance, package techniques capable of achieving a chip-size package are actively being developed to satisfy the requirements for small-form-factor devices, and package techniques capable of promoting efficiency in a package process and improving mechanical and electrical reliability of a packaged product have attracted considerable attention in terms of high package reliability.

Chip-on-film (COF) technology is a new type of package that has been developed on a display driver IC with the trend of light, thin, and compact-sized communication devices. When a high-resolution display device is implemented with the COF technology, driving frequencies of televisions and monitors are increased to increase driving loads of the driver IC, which results in heat generation from integrated circuits. In order to address the problem of heat generation, a dielectric substrate may be provided on its bottom surface with a thermal radiation film to outwardly discharge heat generated from a semiconductor device formed on a top surface of the dielectric substrate.

SUMMARY

Some embodiments of the present inventive concepts provide a semiconductor package with improved structural stability and a method of fabricating the same.

Some embodiments of the present inventive concepts provide a simplified method of fabricating a semiconductor package and a semiconductor package fabricated by using the same.

Some embodiments of the present inventive concepts provide a semiconductor package with improved thermal radiation and increased electrical properties and a method of fabricating the same.

According to some embodiments of the present inventive concepts, a semiconductor package may comprise: a circuit substrate; a semiconductor chip mounted on the circuit substrate; and a thermal radiation film covering the semiconductor chip on the circuit substrate. The semiconductor chip may include: first lateral surfaces that are opposite to each other in a first direction; and second lateral surfaces that are opposite to each other in a second direction that intersects the first direction. A first width of the first lateral surface may be less than a second width of the second lateral surface. The thermal radiation film may cover a top surface of the semiconductor chip and entirely surround the first lateral surfaces and the second lateral surfaces of the semiconductor chip. The thermal radiation film may have a plurality of slits that are directed toward the first lateral surfaces from ends of the thermal radiation film.

According to some embodiments of the present inventive concepts, a semiconductor package may comprise: a base film; a semiconductor chip on the base film, the semiconductor chip having a short lateral surface and a long lateral surface which has a width greater than a width of the short lateral surface; and a thermal radiation film covering the semiconductor chip on the base film The thermal radiation film may include: a central part that overlaps an entirety of the semiconductor chip; and a peripheral part that surrounds the central part and is attached to the base film The thermal radiation film may have a slit on the peripheral part and adjacent to the short lateral surface of the semiconductor chip. The thermal radiation film may include: an adhesion layer; a thermal conduction layer on the adhesion layer; and a protection layer on the thermal conduction layer. A shape of the adhesion layer, a shape of the thermal conduction layer, and a shape of the protection layer in a plan view may be substantially the same.

According to some embodiments of the present inventive concepts, a method of fabricating a semiconductor package may comprise: mounting a semiconductor chip on a base film; providing a thermal radiation film; placing the thermal radiation film on the base film, the thermal radiation film having a central part that overlaps the semiconductor chip and a peripheral part that surrounds the central part, the thermal radiation film including on the peripheral part a slit that extends from an end of the thermal radiation film toward a short lateral surface of the semiconductor chip, and a width of the slit being greater than a width of the short lateral surface of the semiconductor chip; and attaching the thermal radiation film to the base film so as to the central part of the thermal radiation film to contact the semiconductor chip and so as to the peripheral part of the semiconductor chip to contact the base film A top surface and lateral surfaces of the semiconductor chip may be covered with the central part of the thermal radiation film.

DETAILED DESCRIPTION OF EMBODIMENTS

The following will now describe a semiconductor package according to the present inventive concepts with reference to the accompanying drawings.

Figure 1:
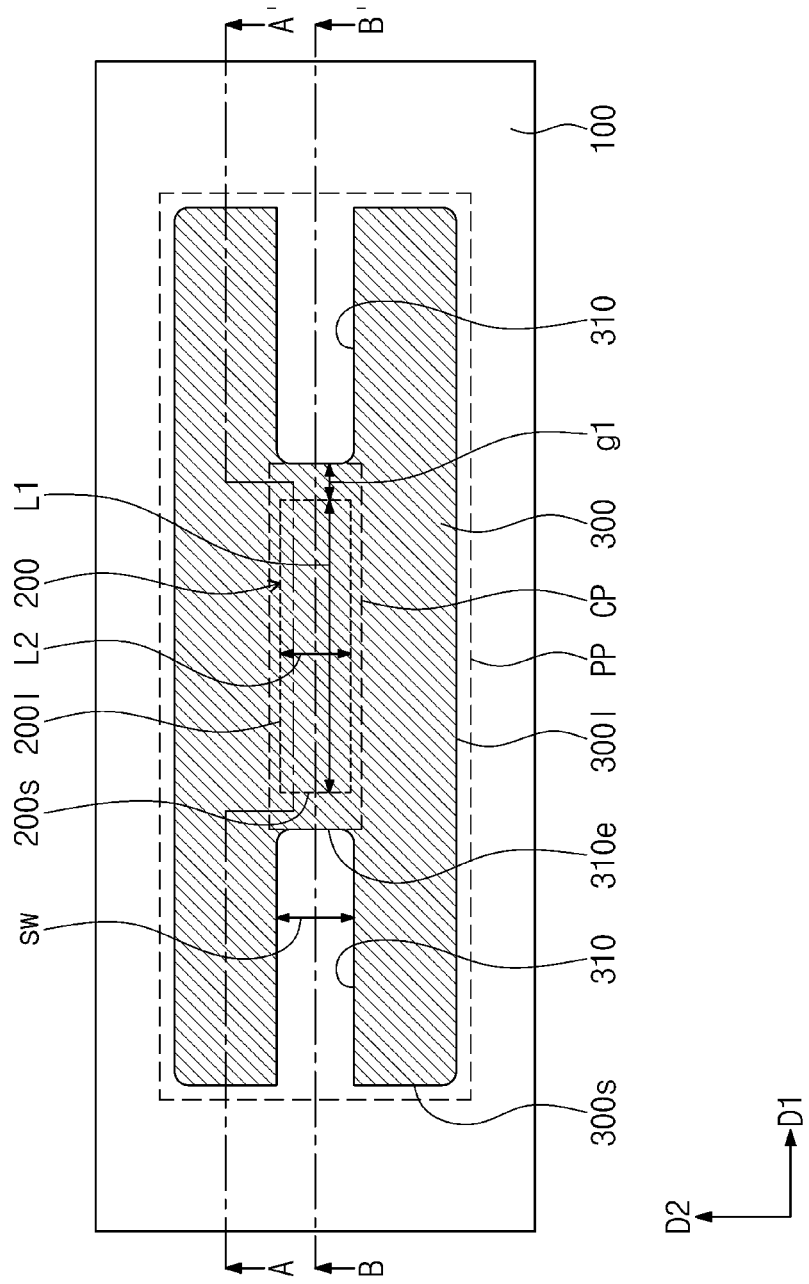
FIG. 1 illustrates a plan view showing a semiconductor package according to some embodiments of the present inventive concepts.
Figure 2:
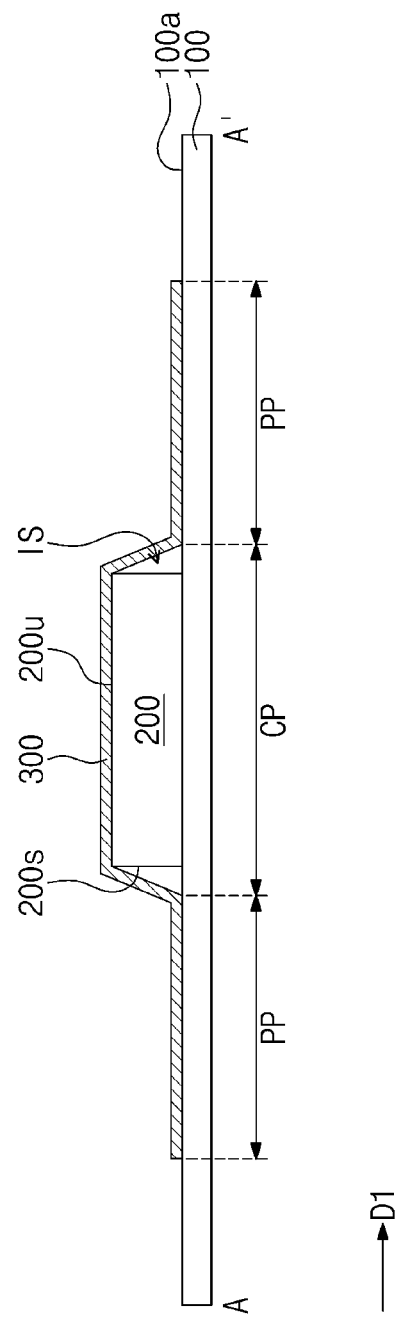
FIGS. 2 to 4 illustrate cross-sectional views showing a semiconductor package according to some embodiments of the present inventive concepts.
Figure 3:
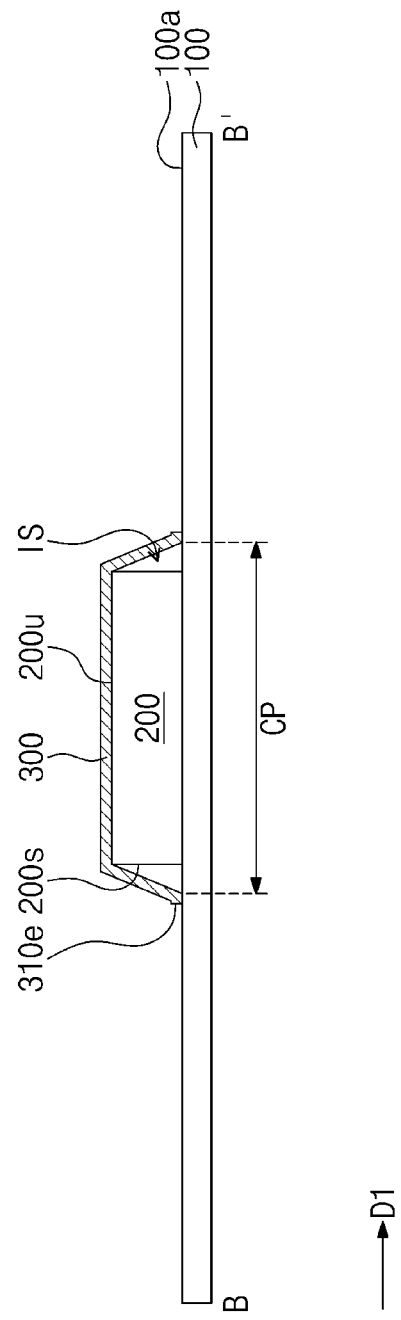
Figure 4:
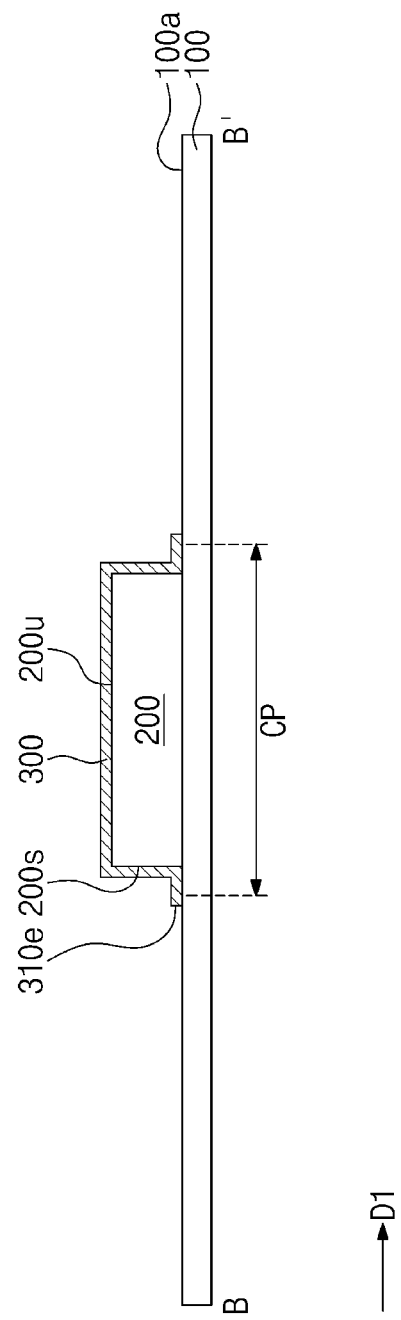
Figure 5:
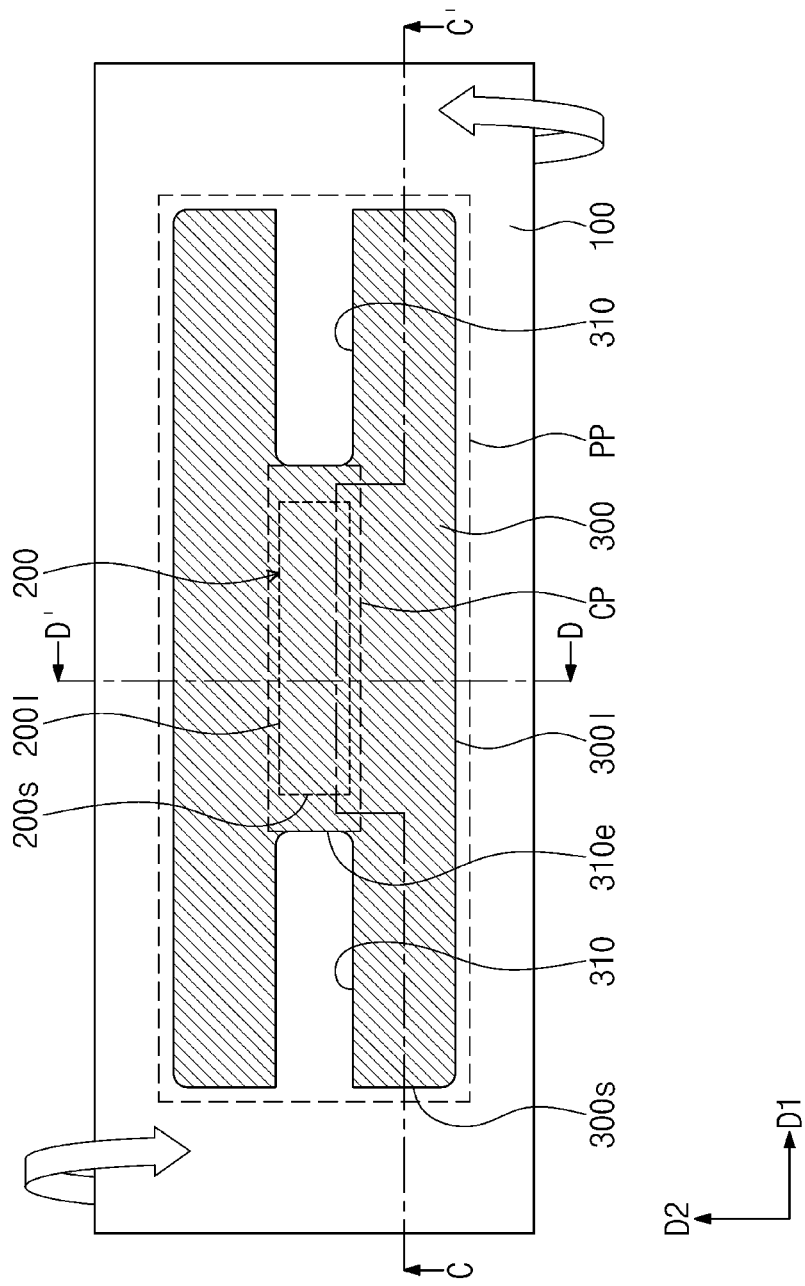
FIG. 5 illustrates a plan view showing deformation of a semiconductor package according to some embodiments of the present inventive concepts.
Figure 6:
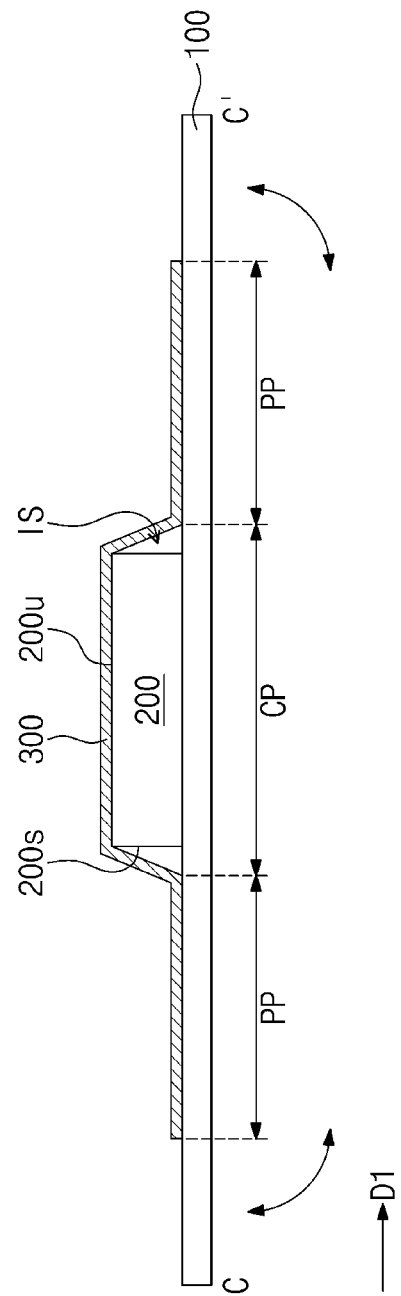
FIGS. 6 and 7 illustrate cross-sectional views showing deformation of a semiconductor package according to some embodiments of the present inventive concepts.
Figure 7:
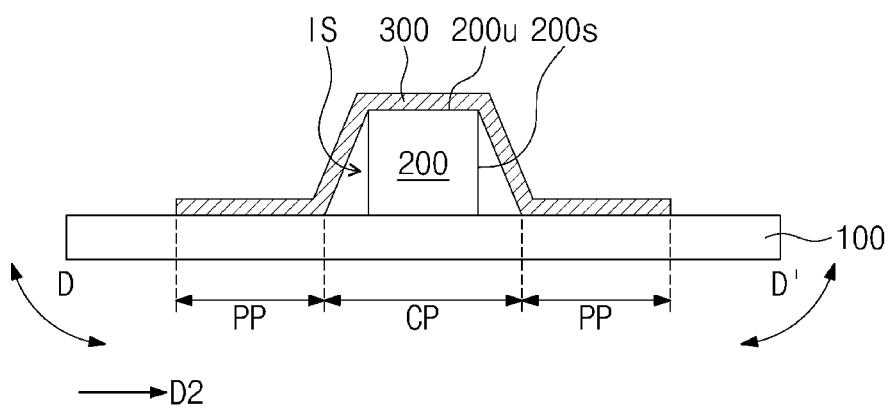

FIG. 1 illustrates a plan view showing a semiconductor package according to some embodiments of the present inventive concepts. FIGS. 2 to 4 illustrate cross-sectional views showing a semiconductor package according to some embodiments of the present inventive concepts. FIG. 2 corresponds to a cross section taken along line A-A' of FIG. 1. FIGS. 3 and 4 correspond to a cross section taken along line B-B' of FIG. 1. FIG. 5 illustrates a plan view showing deformation of a semiconductor package according to some embodiments of the present inventive concepts. FIGS. 6 and 7 illustrate cross-sectional views showing deformation of a semiconductor package according to some embodiments of the present inventive concepts. FIG. 6 corresponds to a cross-section taken along line C-C' of FIG. 5. FIG. 7 corresponds to a cross section taken along line D-D' of FIG. 5.

Referring to FIGS. 1, 2, and 3, a circuit substrate 100 may be provided. The circuit substrate 100 may be a flexible film type substrate. The circuit substrate 100 may include a dielectric material. For example, the circuit substrate 100 may include a substrate formed of a flexible material, such as polyimide (PI). Alternatively, the circuit substrate 100 may include a rigid substrate. The circuit substrate 100 may include or may be, for example, a printed circuit board (PCB), a redistribution substrate in which a dielectric pattern and a conductive pattern are stacked alternately with each other, a semiconductor wafer, or any other suitable substrate.

A semiconductor chip 200 may be provided on the circuit substrate 100. The semiconductor chip 200 may be mounted on a bonding terminal such as a lead frame or a pad provided on the circuit substrate 100. The semiconductor chip 200 may have a top surface 200u substantially parallel to a top surface 100a of the circuit substrate 100. The present inventive concepts, however, are not limited thereto. The semiconductor chip 200 may have a rectangular shape in a plan view. For example, the semiconductor chip 200 may have a first length L1 in a first direction D1 greater than a second length L2 in a second direction D2. The first direction D1 and the second direction D2 may be parallel to the top surface 100a of the circuit substrate 100 and may be orthogonal to each other. The semiconductor chip 200 may have short lateral surfaces 200s that are opposite to each other in the first direction D1 and long lateral surfaces 200l that are opposite to each other in the second direction D2. In this description, the term "short lateral surface" may indicate a lateral surface which has a width/length less than those of other lateral surfaces of a certain component, and the term "long lateral surface" may indicate a lateral surface which has a width/length greater than those of other lateral surfaces of the certain component. In addition, the term "width of a lateral surface" may denote a width obtained when the lateral surface is measured in a direction parallel to a top surface perpendicular to the lateral surface. A width (e.g., identical to the first length L1) of each long lateral surface 200l of the semiconductor chip 200 may be greater than a width (e.g., identical to the second length L2) of each short lateral surface 200s of the semiconductor chip 200. The semiconductor chip 200 may have a rectangular hexahedral shape (or bar shape) that extends lengthwise in the first direction D1. In this description, it is not required that the semiconductor chip 200 should have an exact rectangular hexahedral shape (or bar shape), and the semiconductor chip 200 may have any suitable shape in which a length in the first direction D1 is greater than a length in the second direction D2. The semiconductor chip 200 may be a transistor such as junction transistor or field effect transistor, a diode such as rectification diode, light emitting diode, or photodiode, a memory element, or an active element such as integrated circuit. Alternatively, the semiconductor chip 200 may be a passive element such as condenser, resistor, or coil.

Terms such as "same," "equal," "parallel," "perpendicular," "planar," or "coplanar," as used herein encompass identicality or near identicality including variations that may occur, for example, due to manufacturing processes. The term "substantially" may be used herein to emphasize this meaning, unless the context or other statements indicate otherwise.

An item, layer, or portion of an item or layer described as extending "lengthwise" in a particular direction has a length in the particular direction and a width perpendicular to that direction, where the length is greater than the width.

A thermal radiation film 300 may be provided on the circuit substrate 100. The thermal radiation film 300 may cover the semiconductor chip 200. The thermal radiation film 300 may closely attach the semiconductor chip 200 to the circuit substrate 100, and may outwardly discharge heat received from the semiconductor chip 200. The thermal radiation film 300 may have a planar shape larger than that of the semiconductor chip 200. Planar shapes in the present disclosure may mean shapes in plan views. For example, the thermal radiation film 300 may have a larger area than the semiconductor chip 200 in a plan view. The thermal radiation film 300 may have a length in the first direction D1 greater than a length in the second direction D2. For example, the thermal radiation film 300 may have a rectangular shape in a plan view. The thermal radiation film 300 may have short sides 300s that are opposite to each other in the first direction D1 and long sides 300l that are opposite to each other in the second direction D2. The thermal radiation film 300 may have first ends or the short sides 300s that face the short lateral surfaces 200s of the semiconductor chip 200, and may also have second ends or the long sides 300l that face the long lateral surfaces 200l of the semiconductor chip 200. In this description, the term "short side" may indicate a side which has a length less than those of other sides of a certain shape, and the term "long side" may indicate a side which has a length greater than those of other sides of the certain shape. In this description, the thermal radiation film 300 may have various planar shapes in which a length in the first direction D1 is greater than a length in the second direction D2. The planar shapes in the present description may be shapes in plan views. The thermal radiation film 300 may have a thickness of, for example, about 10 μm to about 50 μm. The present inventive concepts, however, are not limited thereto. The thickness of the thermal radiation film 300 may be variously changed depending on configuration and size of the thermal radiation film.

As shown in FIG. 1, the thermal radiation film 300 may have rounded corners. For example, the thermal radiation film 300 may not have a prismatic shape, but may have a rounded shape at its corners where the short sides 300s meet the long sides 300l. For example, the corners of the thermal radiation film 300 may each have a curvature radius of about 0.1 mm to about 0.3 mm Alternatively, the corners of the thermal radiation film 300 may not have rounded shapes, but may have vertex shapes where the short sides 300s meet the long sides 300l.

The thermal radiation film 300 may be formed of a metallic material, such as copper (Cu), aluminum (Al), or stainless steels, or formed of a non-metallic material with high thermal conductivity. When the thermal radiation film 300 is formed of a metallic material, the thermal radiation film 300 may have an electromagnetic shielding effect that blocks electromagnetic waves from outside or generated from the semiconductor chip 200. The thermal radiation film 300 may be made of a single-layered film or a multi-layered film The following will describe in detail the multi-layered thermal radiation film 300 with reference to FIGS. 13 and 14.

The thermal radiation film 300 may have a central part CP that covers the semiconductor chip 200 and a peripheral part PP that surrounds the central part CP.

The central part CP of the thermal radiation film 300 may correspond to a portion that provides an internal space IS to accommodate the semiconductor chip 200 on the circuit substrate 100. For example, the central part CP of the thermal radiation film 300 may overlap an entirety of the semiconductor chip 200, e.g., in a vertical direction, and may cover the top surface 200u, the short lateral surfaces 200s , and the long lateral surfaces 200l of the semiconductor chip 200. The semiconductor chip 200 may be interposed between the circuit substrate 100 and the central part CP of the the thermal radiation film 300. The central part CP of the thermal radiation film 300 may be in contact with the top surface 200u of the semiconductor chip 200. Therefore, the central part CP of the thermal radiation film 300 may directly receive heat from the semiconductor chip 200 to outwardly discharge the heat through a top surface of the thermal radiation film 300.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The central part CP of the thermal radiation film 300 may be disposed on and spaced apart from the lateral surfaces 200s and 200l of the semiconductor chip 200. The central part CP of the thermal radiation film 300 may not be significantly spaced apart from the lateral surfaces 200s and 200l of the semiconductor chip 200. For example, on the lateral surfaces 200s and 200l of the semiconductor chip 200, an angle ranging from about 0° to about 45° may be provided between the central part CP of the thermal radiation film 300 and each of the lateral surfaces 200s and 200l of the semiconductor chip 200. For example, as shown in FIG. 4, the central part CP of the thermal radiation film 300 may be in contact with the lateral surfaces 200s and 200l of the semiconductor chip 200. For example, on the lateral surfaces 200s and 200l of the semiconductor chip 200, an angle of about 0° may be provided between the central part CP of the thermal radiation film 300 and each of the lateral surfaces 200s and 200l of the semiconductor chip 200. When the central part CP of the semiconductor chip 200 is in contact with the lateral surfaces 200s and 200l of the semiconductor chip 200, the thermal radiation film 300 may receive heat through the lateral surfaces 200s and 200l of the semiconductor chip 200, and may increase in thermal radiation efficiency. The following description will focus on the embodiment of FIG. 3.

The peripheral part PP of the thermal radiation film 300 may correspond to a portion that attaches the thermal radiation film 300 to the circuit substrate 100. In a plan view, the peripheral part PP of the thermal radiation film 300 may completely surround the central part CP of the thermal radiation film 300. The peripheral part PP of the thermal radiation film 300 may be attached to the top surface 100a of the circuit substrate 100 around the semiconductor chip 200. Therefore, the internal space IS may be hermetically sealed which is a space between the circuit substrate 100 and the thermal radiation film 300 or which is defined between the circuit substrate 100 and the central part CP of the thermal radiation film 300. The peripheral part PP of the thermal radiation film 300 may closely attach the semiconductor chip 200 to the circuit substrate 100, and the semiconductor chip 200 may be rigidly mounted on the circuit substrate 100. The peripheral part PP of the thermal radiation film 300 may receive heat from the semiconductor chip 200 through the central part CP of the thermal radiation film 300, and the heat may be outwardly discharged. For example, the thermal radiation film 300 may have a thermal radiation area that corresponds to a sum of an area of the central part CP and an area of the peripheral part PP, and the peripheral part PP may increase the thermal radiation area of the thermal radiation film 300, with the result that a semiconductor package may increases in thermal radiation efficiency.

The thermal radiation film 300 may have slits 310. The slits 310 may be positioned on the peripheral part PP of the thermal radiation film 300. For example, on the peripheral part PP, the slits 310 may be disposed adjacent to the short lateral surfaces 200s of the semiconductor chip 200. The slits 310 may be positioned between the semiconductor chip 200 and the short sides 300s of the thermal radiation film 300. The slits 310 may be connected to the short sides 300s of the thermal radiation film 300. The slits 310 may extend from the short sides 300s of the thermal radiation film 300 toward the short lateral surfaces 200s of the semiconductor chip 200. For example, each of the slits 310 may extend from one of the short sides 300s of the thermal radiation film 300 toward a facing one of the short lateral surfaces 200s of the semiconductor chip 200. For example, the slits 310 may be open to outside of the thermal radiation film 300 through respective short sides 300s . As shown in FIG. 1, the slits 310 may each have a linear or rectangular shape that extends in the first direction D1 or its opposite direction from the short side 300s of the thermal radiation film 300. Therefore, the thermal radiation film 300 including the slits 310 may have an H shape, e.g., in a plan view. The slits 310 may each have a slit width sw measured in the second direction D2, and the slit width sw may be about 0.8 times to about 2 times the width of the short lateral surfaces 200s of the semiconductor chip 200 (or the second length L2 in the second direction D2 of the semiconductor chip 200). For example, the slit width sw of the slit 310 may be substantially the same as the second length L2 of the short lateral surfaces 200s of the semiconductor chip 200. The slit width sw of the slit 310 may range, for example, from about 0.5 mm to about 10 mm In certain embodiments, the slit width sw of the slit 310 may be about 3 mm.

The slits 310 may each have an end 310e opposite to the short side 300s of the thermal radiation film 300, and the end 310e may be spaced apart at a first interval g1 from a corresponding one of the short lateral surfaces 200s of the semiconductor chip 200. The first interval g1 may be given to a distance between the slit 310 and its corresponding one of the short lateral surfaces 200s of the semiconductor chip 200. The first interval g1 may be about 1% to about 20% of the width of the long lateral surfaces 200l of the semiconductor chip 200. For example, the first interval g1 may range from about 1 mm to about 2.5 mm In certain embodiments, the first interval g1 may be about 1.5 mm As shown in FIG. 1, the end 310e of the slit 310 may have rounded corners. For example, the slit 310 may not have a prismatic shape, but may have a rounded shape at the corners of the end 310e . For example, the corners of the end 310e of the slit 310 may each have a curvature radius of about 0.05 mm to about 0.1 mm Alternatively, the end 310e of the slit 310 may not have rounded shapes, and but may have vertex shapes at the corners thereof.

According to some embodiments of the present inventive concepts, as the slits 310 are formed at the thermal radiation film 300, there may be a reduction in stress applied to the thermal radiation film 300. With reference to FIGS. 5 to 7, the following will describe in detail a reduction in deformation and stress of the thermal radiation film 300. FIG. 5 illustrates a plan view showing deformation of a semiconductor package according to some embodiments of the present inventive concepts. FIGS. 6 and 7 illustrate cross-sectional views showing deformation of a semiconductor package according to some embodiments of the present inventive concepts.

A semiconductor package may be a deformable electronic device such as a flexible device, a foldable device, or a wearable device. For example, when an external force is applied to the semiconductor package, the semiconductor package may change in shape. As designated by arrows shown in FIG. 5, the semiconductor package may be twisted by an external force. For example, when viewed along the first direction D1, the semiconductor package may rotate in different directions at its opposite ends in the first direction D 1. Alternatively, the semiconductor package may be bent or rolled by an external force. For example, as designated by arrows shown in FIG. 6, when viewed along the first direction D1, one end of the semiconductor package may ascend to a higher level or descend to a lower level than another end of the semiconductor package. For another example, as designated by arrows shown in FIG. 7, when viewed along the second direction D2, one end of the semiconductor package may ascend to a higher level or descend to a lower level than another end of the semiconductor package. The semiconductor package may move or be deformed freely without being limited thereto. For example, the above-described bending, rolling, and twisting may be concurrently generated due to an external force applied to the semiconductor package. For example, one end of the semiconductor package may twist or ascend while approaching another end of the semiconductor package. For example, a center portion of the circuit substrate 100 may ascend or descend while edge/end portions of the circuit substrate 100 remain at the same vertical level.

Spatially relative terms, such as "beneath," "below," "lower," "above," "upper," "vertical," "horizontal" and the like, may be used herein for ease of description to describe positional relationships. It will be understood that the spatially relative terms encompass different orientations of the device in addition to the orientation depicted in the figures.

As shown in FIGS. 6 and 7, the thermal radiation film 300 may be located at different levels on the central part CP and the peripheral part PP. In addition, the central part CP of the thermal radiation film 300 may be attached to the semiconductor chip 200, and the peripheral part PP of the thermal radiation film 300 may be attached to the circuit substrate 100. Therefore, when a semiconductor package is deformed, the central part CP of the thermal radiation film 300 may have different behavior from that of the peripheral part PP of the thermal radiation film 300, and a stress applied to the thermal radiation film 300 may be the largest between the central part CP and the peripheral part PP. For example, when a length in the first direction D1 of the semiconductor chip 200 is greater than a length in the second direction D2 of the semiconductor chip 200, the largest boundary between the central part CP and the peripheral part PP may be provided on an end in the first direction D1 of the semiconductor chip 200. For example, the largest stress may be applied to the thermal radiation film 300 in the vicinity of the short lateral surfaces 200s of the semiconductor chip 200.

According to some embodiments of the present inventive concepts, because the slits 310 are formed at the thermal radiation film 300, the slits 310 may relieve a stress due to the deformation of the thermal radiation film 300. For example, because the slits 310 are formed adjacent to the short lateral surfaces 200s of the semiconductor chip 200, it may be possible to effectively relieve the stress applied to the thermal radiation film 300 in the vicinity of the short lateral surfaces 200s of the semiconductor chip 200. As a result, a semiconductor package may be provided to have increased structural stability.

In addition, the slits 310 may be formed to have linear shapes that extend from the short sides 300s of the thermal radiation film 300 toward the short lateral surfaces 200s of the semiconductor chip 200, and the slits 310 may occupy small areas in the thermal radiation film 300. For example, because the slits 310 are formed to correspond to the short lateral surfaces 200s of the semiconductor chip 200, the slit widths sw of the slits 310 may be small, and thus the slits 310 may occupy small areas. In this case, it may be possible to increase a thermal radiation area of the thermal radiation film 300 and a contact area between the thermal radiation film 300 and the circuit substrate 100. Therefore, the thermal radiation film 300 may relieve a stress that occurs when a semiconductor package is deformed, and also may increase thermal radiation efficiency and adhesion to the circuit substrate 100. A semiconductor package may thus be provided to have increased structural stability and improved thermal radiation efficiency.

In addition, the thermal radiation film 300 may entirely surround the top surface 200u, the short lateral surfaces 200s , and the long lateral surfaces 200l of the semiconductor chip 200. For example, the thermal radiation film 300 may contact all of the top surface 200u, the short lateral surfaces 200s , and the long lateral surfaces 200l of the semiconductor chip 200. For example, the semiconductor chip 200 may not be exposed outside the thermal radiation film 300, and may be prevented from being in contact with air caused by partial opening of the thermal radiation film 300. In this case, the semiconductor chip 200 may be completely covered with the thermal radiation film 300. The term "completely covered" in this context may indicate that no part of an object or objects are exposed to the outside. Therefore, there may be an improvement in heat transfer from the semiconductor chip 200 to the thermal radiation film 300. In addition, there may be a uniformity of heat transfer to the thermal radiation film 300 throughout the semiconductor chip 200, and thus the semiconductor chip 200 may have no temperature gradient therein, with the result that the semiconductor chip 200 may be less damaged due to heat. Moreover, the thermal radiation film 300 that surrounds the entirety of the semiconductor chip 200 may have an electromagnetic shielding effect.

In relation to FIGS. 5 to 7, it is explained that a semiconductor package is a deformable electronic device and that the semiconductor package is deformed by an external force, but the present inventive concepts are not limited thereto. Even when the circuit substrate 100 is formed of a rigid substrate such as a printed circuit board (PCB), the semiconductor package may be partially deformed due to an external force or heat-induced warpage. According to some embodiments of the present inventive concepts, because the thermal radiation film 300 includes the slits 310 formed adjacent to the short lateral surfaces 200s of the semiconductor chip 200, it may be possible to provide a semiconductor package with improved structural stability and increased thermal radiation efficiency.

Figure 8:
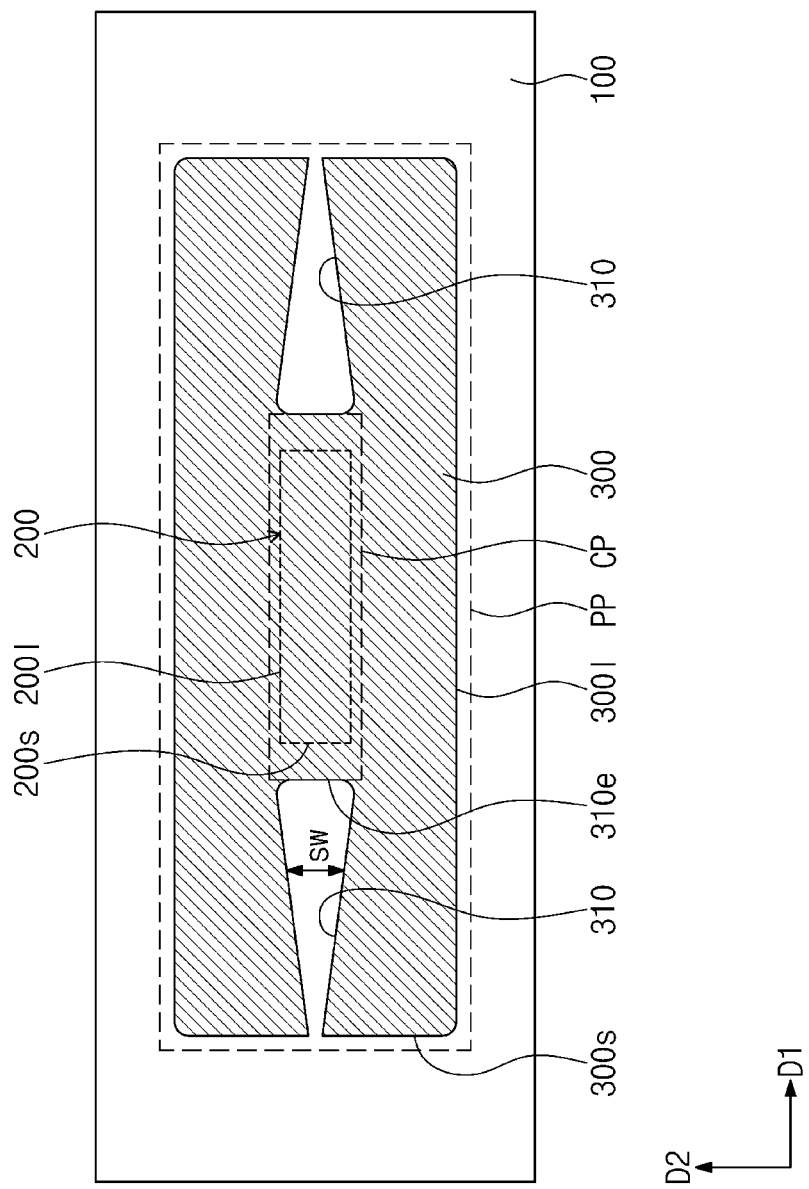
FIG. 8 illustrates a plan view showing a semiconductor package according to some embodiments of the present inventive concepts.

FIG. 8 illustrates a plan view showing a semiconductor package according to some embodiments of the present inventive concepts. In the embodiments that follow, a detailed description of technical features repetitive to those discussed above with reference to FIGS. 1 to 7 will be omitted or briefly described and differences will be discussed in detail. The same reference numerals will be allocated to the components the same as or similar to those of the semiconductor package discussed above.

Referring to FIG. 8, on the peripheral part PP, the slits 310 may be disposed adjacent to the short lateral surfaces 200s of the semiconductor chip 200. For example, the slits 310 may be positioned between the semiconductor chip 200 and the short sides 300s of the thermal radiation film 300. The slits 310 may be connected to the short sides 300s of the thermal radiation film 300. For example, the slits 310 may be open to an outside of the thermal radiation film 300 through the respective short sides 300s. The slits 310 may extend from the short sides 300s of the thermal radiation film 300 toward the short lateral surfaces 200s of the semiconductor chip 200. For example, each of the slits 310 may extend from one of the short sides 300s of the thermal radiation film 300 toward a facing one of the short lateral surfaces 200s of the semiconductor chip 200. As shown in FIG. 8, the slits 310 may have their slit widths sw, e.g., in the second direction, each of which increases in a direction approaching the semiconductor chip 200 from the short side 300s of the thermal radiation film 300. For example, the slits 310 may each have a triangular shape or a dew shape which has a vertex directed toward the short side 300s of the thermal radiation film 300. In certain embodiments, each of the slits 310 may have a trapezoid shape. The slits 310 may have their largest widths, e.g., in the second direction D2, in regions adjacent to the short lateral surfaces 200s of the semiconductor chip 200, and may also have their smallest widths, e.g., in the second direction D2, in regions adjacent to the short sides 300s of the thermal radiation film 300. For example, in the region adjacent to the short lateral surfaces 200s of the semiconductor chip 200, the slit width sw of the slit 310 may be about 0.8 times to about 2 times the width of the short lateral surfaces 200s of the semiconductor chip 200 (or the second length L2 in the second direction D2 of the semiconductor chip 200). For example, in the region adjacent to the short lateral surfaces 200s of the semiconductor chip 200, the slit width sw of the slit 310 may be substantially the same as the second length L2 of the short lateral surfaces 200s of the semiconductor chip 200.

According to some embodiments of the present inventive concepts, because the slits 310 are formed adjacent to the short lateral surfaces 200s of the semiconductor chip 200, it may be possible to effectively relieve a stress applied to the thermal radiation film 300 in the vicinity of the short lateral surfaces 200s of the semiconductor chip 200. In addition, because the slit width sw of the slit 310 decreases in a direction receding from the short lateral surfaces 200s of the semiconductor chip 200, the thermal radiation film 300 of a semiconductor package may have an increased overall area, and thus may have high efficiency of thermal radiation and excellent adhesion to the circuit substrate 100.

Figure 9:
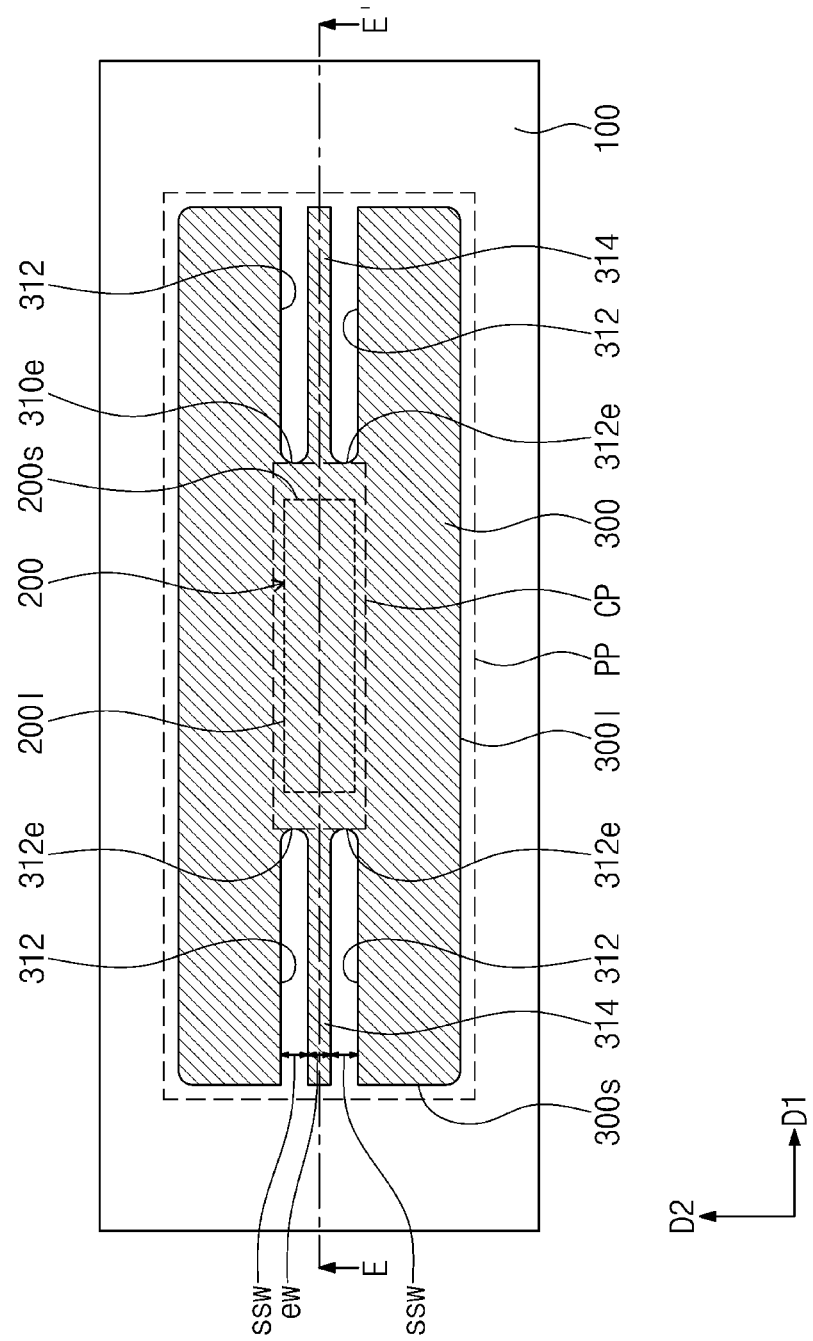
FIG. 9 illustrates a plan view showing a semiconductor package according to some embodiments of the present inventive concepts.
Figure 10:
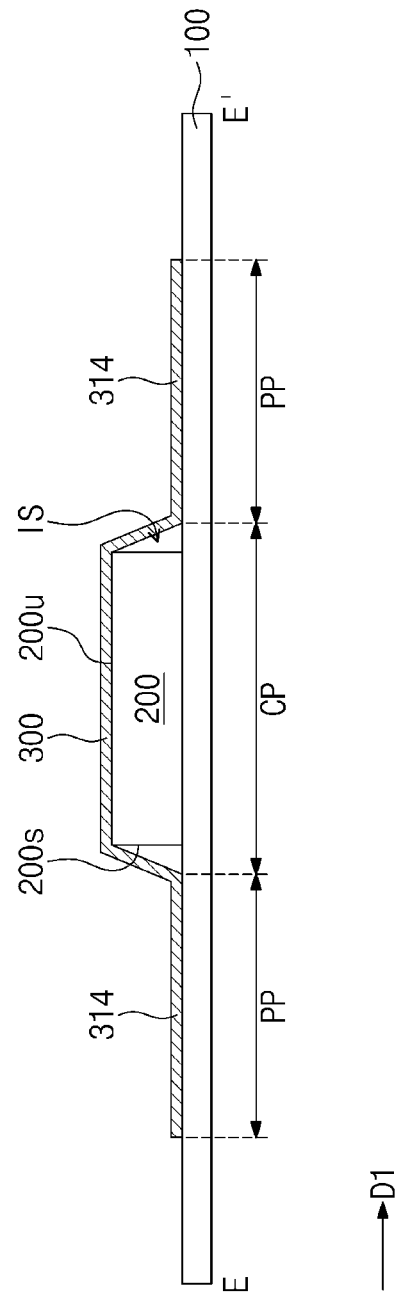
FIG. 10 illustrates a cross-sectional view showing a semiconductor package according to some embodiments of the present inventive concepts.

FIG. 9 illustrates a plan view showing a semiconductor package according to some embodiments of the present inventive concepts. FIG. 10 illustrates a cross-sectional view taken along line E-E' of FIG. 9, showing a semiconductor package according to some embodiments of the present inventive concepts.

FIGS. 1 to 8 depict that a single slit 310 is provided on one of the short lateral surfaces 200s of the semiconductor chip 200, but the present inventive concepts are not limited thereto.

Referring to FIGS. 9 and 10, at least two sub-slits 312 may be provided on each of the short lateral surfaces 200s of the semiconductor chip 200. The following will describe configurations of the sub-slits 312 connected to one short side 300s of the thermal radiation film 300. The sub-slits 312 may extend from the short side 300s of the thermal radiation film 300 toward a facing short lateral surface 200s of the semiconductor chip 200. The sub-slits 312 may have their ends 312e that are provided adjacent to corners of the semiconductor chip 200. In this case, the corners may indicate sides where the short lateral surfaces 200s meet the long lateral surfaces 200l of the semiconductor chip 200. The sub-slits 312 may extend in the first direction D1 and may be spaced apart from each other in the second direction D2. For example, the sub-slits 312 may have their linear shapes that extend from one short side 300s of the thermal radiation film 300 toward the corners of the semiconductor chip 200. Compared to the embodiment shown in FIG. 1, the embodiment of FIG. 9 corresponds to a shape that each of the slits (see 310 of FIG. 1) may have in its inside an extension 314 that extends in the first direction D1 from the thermal radiation film 300. Referring back to FIGS. 9 and 10, the extension 314 may define shapes of the sub-slits 312, and the sub-slits 312 may be spaced apart from each other across the extension 314. The sub-slits 312 may each have a sub-slit width ssw less than the width of the short lateral surfaces 200s of the semiconductor chip 200 (or the second length L2 in the second direction D2 of the semiconductor chip 200). The sub-slit width ssw of the sub-slit 312 may be about 0.3 times to about 0.5 times the second length L2 of the short lateral surfaces 200s of the semiconductor chip 200. The extension 314 may have an extension width ew less than about 0.5 times the second length L2 of the short lateral surfaces 200s of the semiconductor chip 200.

When the semiconductor chip 200 has a tetragonal shape in a plan view, a larger or largest stress may be applied to the thermal radiation film 300 in the vicinity of the semiconductor chip 200. According to some embodiments of the present inventive concepts, because the sub-slits 312 are formed adjacent to the corners of the semiconductor chip 200, it may be possible to effectively relieve the stress applied to the thermal radiation film 300 in the vicinity of the corners of the semiconductor chip 200. In addition, the extension 314 between the sub-slits 312 may be attached to the circuit substrate 100 at regions adjacent to the lateral surfaces 200s of the semiconductor chip 200. Therefore, ends in the first direction D1 of the semiconductor chip 200 may be rigidly attached through the extension 314 to the circuit substrate 100.

Figure 11:
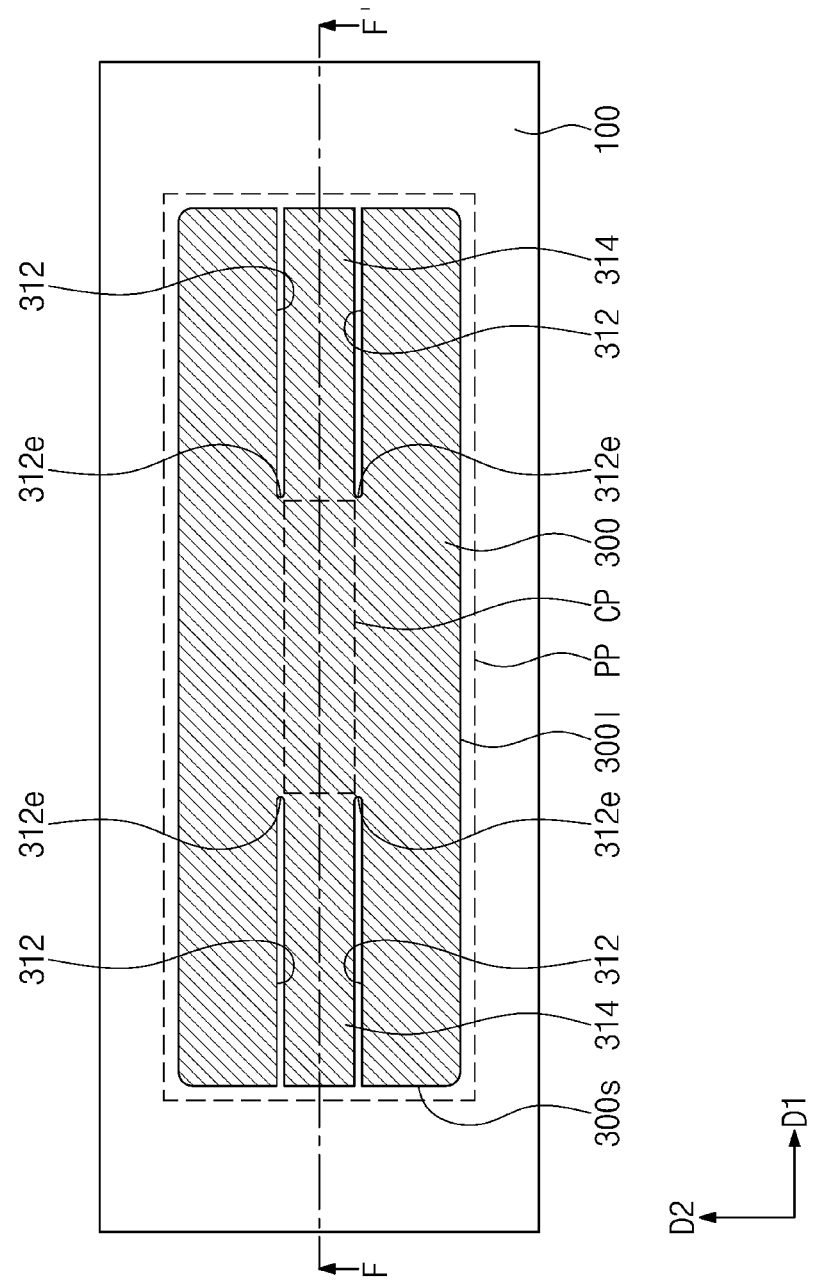
FIG. 11 illustrates a plan view showing a semiconductor package according to some embodiments of the present inventive concepts.
Figure 12:
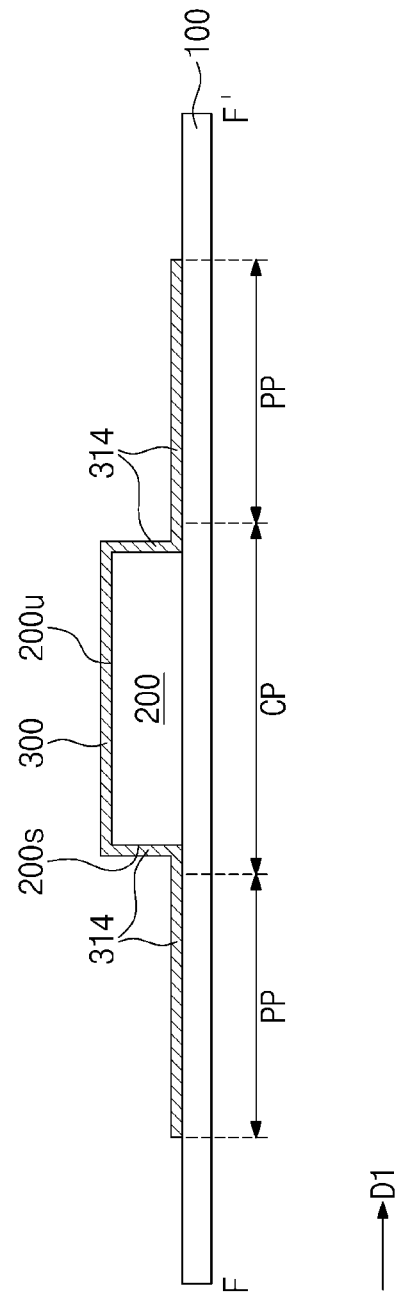
FIG. 12 illustrates a cross-sectional view showing a semiconductor package according to some embodiments of the present inventive concepts.

FIG. 11 illustrates a plan view showing a semiconductor package according to some embodiments of the present inventive concepts. FIG. 12 illustrates a cross-sectional view taken along line F-F' of FIG. 11, showing a semiconductor package according to some embodiments of the present inventive concepts.

As shown in FIGS. 11 and 12, the sub-slits 312 may be in contact with the corners of the semiconductor chip 200. In this case, the extension width ew of the extension 314 may be substantially the same as the width of the short lateral surfaces 200s of the semiconductor chip 200 (or the second length L2 in the second direction D2 of the semiconductor chip 200), and the sub-slits 312 may be spaced apart in the second direction D2 from each other across the extension 314. The sub-slit width ssw of the sub-slit 312 may be less than the second length L2 of the short lateral surfaces 200s of the semiconductor chip 200. The extension 314 may be in contact with the short lateral surfaces 200s of the semiconductor chip 200. Therefore, no empty space may be formed between the extension 314 and the semiconductor chip 200, and there may be an increase in efficiency of thermal radiation through the extension 314 from the short lateral surfaces 200s of the semiconductor chip 200. In addition, the extension 314 whose area is relatively large may cause that ends in the first direction D1 of the semiconductor chip 200 is rigidly attached to the circuit substrate 100.

Figure 13:
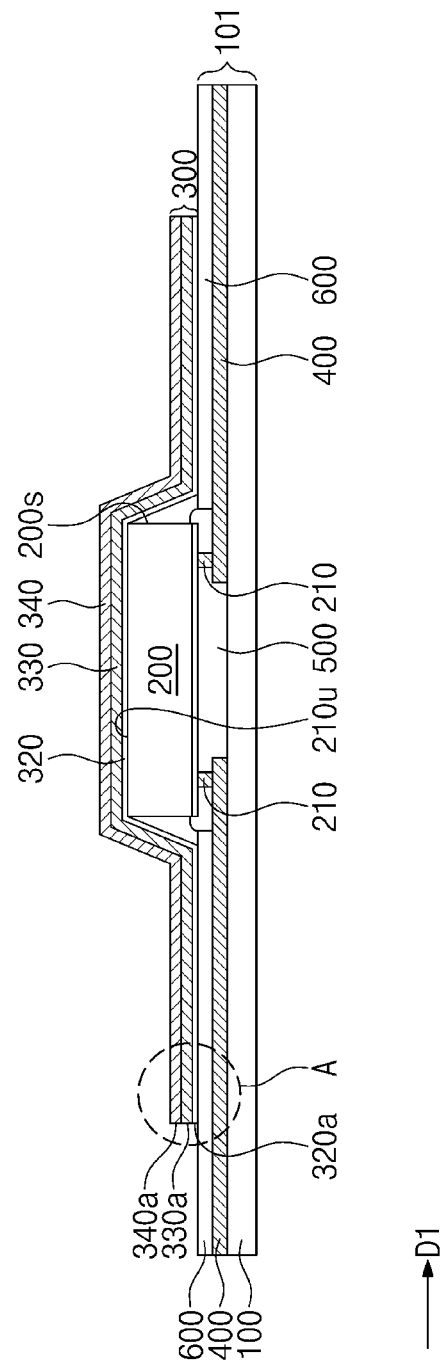
FIG. 13 illustrates a cross-sectional view showing a semiconductor package according to some embodiments of the present inventive concepts.
Figure 14:
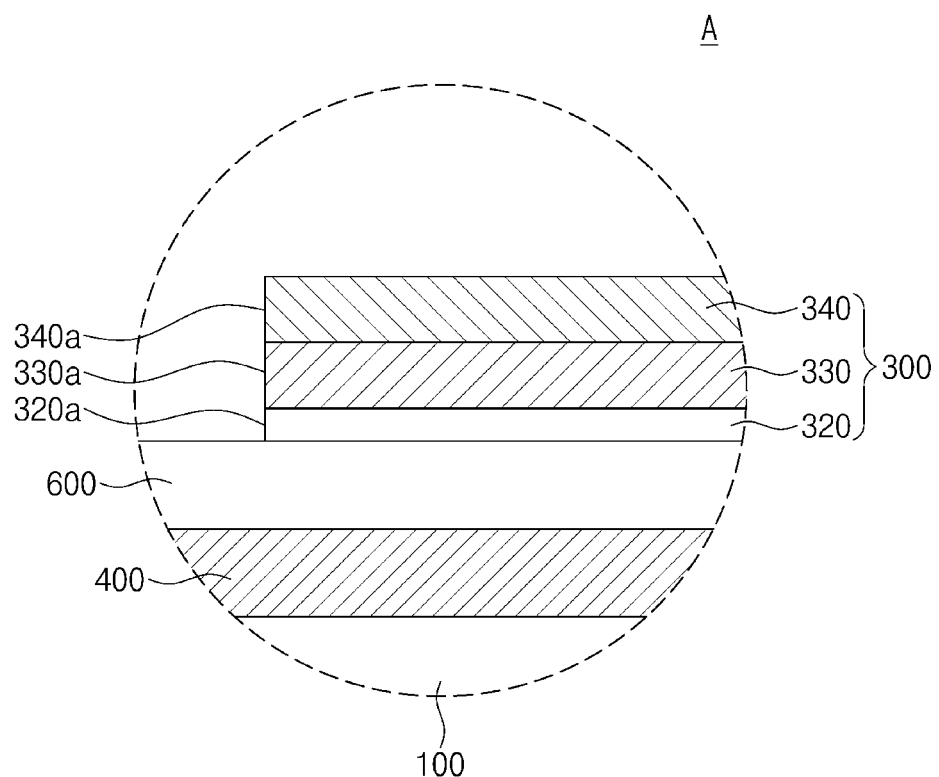
FIG. 14 illustrates an enlarged view showing section A of FIG. 13.

FIG. 13 illustrates a cross-sectional view showing a semiconductor package according to some embodiments of the present inventive concepts. FIG. 14 illustrates an enlarged view showing section A of FIG. 13.

Referring to FIGS. 13 and 14, a semiconductor package may be a chip-on-film (COF) type semiconductor device.

A base film 101 may be provided. The base film 101 may have a circuit substrate 100 and lead frames 400 formed on the circuit substrate 100.

The circuit substrate 100 may be a flexible film type substrate. The circuit substrate 100 may include a dielectric material. For example, the circuit substrate 100 may include polyimide (PI).

The lead frames 400 may be provided on the circuit substrate 100. A configuration of the lead frame 400 will be discussed together with an arrangement of the semiconductor chip 200.

Although not shown, the circuit substrate 100 may have a thermal radiation member disposed on a bottom surface thereof. The thermal radiation member may cover an entirety of the bottom surface of the circuit substrate 100. Alternatively, the thermal radiation member may be disposed only below a region where the semiconductor chip 200 is mounted on the base film 101. The thermal radiation member may be in contact with the bottom surface of the circuit substrate 100. The thermal radiation member may be provided to externally discharge heat that is generated from the semiconductor chip 200 and then is transferred downwardly through the lead frames 400. The thermal radiation member may include a metallic conductor or an insulator which has a high thermal conductivity. For example, the thermal radiation member may include or be formed of aluminum (Al).

The semiconductor chip 200 may be mounted on the base film 101. The semiconductor chip 200 may be a flip-chip mounted on the base film 101. For example, a front surface of the semiconductor chip 200 may be directed toward the base film 101. In this description below, the term "front surface" may be defined to refer to an active surface on which a circuit layer of the semiconductor chip 200 is formed, and the term "rear surface" may be defined to refer to an inactive surface or a surface opposite to the front surface. For example, the semiconductor chip 200 may include chip pads 210 provided on the front surface thereof. The chip pads 210 may face the base film 101.

The lead frames 400 may be provided between the circuit substrate 100 and the semiconductor chip 200. The semiconductor chip 200 may be coupled to the lead frames 400 provided on a top surface of the circuit substrate 100. For example, the chip pads 210 of the semiconductor chip 200 may be in contact with the lead frames 400. The circuit substrate 100 may be provided thereon with the lead frames 400 electrically connected to the chip pads 210 of the semiconductor chip 200. On the circuit substrate 100, the lead frames 400 may serve to transfer electrical signals from the semiconductor chip 200 to an external output apparatus. The lead frames 400 may be disposed spaced apart from each other. The lead frames 400 may have their outer distal ends that extend toward an outer side of the semiconductor chip 200. The lead frames 400 may include or be formed of metal, such as copper (Cu).

As used herein, components described as being "electrically connected" are configured such that an electrical signal can be transferred from one component to the other (although such electrical signal may be attenuated in strength as it transferred and may be selectively transferred).

An under-fill part 500 may be provided between the base film 101 and the semiconductor chip 200. The under-fill part 500 may fill a space between the base film 101 and the semiconductor chip 200. The under-fill part 500 may encapsulate the chip pads 210 and may partially cover the lead frames 400. The under-fill part 500 may include, for example, an anisotropic conductive film (ACF) or a non-conductive paste (NCP).

A surface dielectric layer 600 may further be provided in the base film 101. The surface dielectric layer 600 may partially cover the lead frames 400 that outwardly extend from the semiconductor chip 200. For example, a solder resist layer may be used as the surface dielectric layer 600. The surface dielectric layer 600 may be provided to cover the lead frames 400.

The thermal radiation film 300 may be provided on the surface dielectric layer 600. The thermal radiation film 300 may cover the semiconductor chip 200. The thermal radiation film 300 may closely attach the semiconductor chip 200 to the base film 101, and may outwardly discharge heat generated from the semiconductor chip 200. The thermal radiation film 300 may have a planar shape the same as or similar to that discussed with reference to FIGS. 1 to 12. For example, the thermal radiation film 300 may have a planar shape larger than that of the semiconductor chip 200. For example, a plan view of the thermal radiation film 300 of the embodiment illustrated in FIGS. 13 and 14 may be the same as or similar to any plan view of the thermal radiation films 300 of the embodiments illustrated in FIGS. 1 to 12. The thermal radiation film 300 may have a length in the first direction D1 greater than a length in the second direction D2. For example, the thermal radiation film 300 may have a rectangular shape in a plan view. The thermal radiation film 300 may have slits 310. The slits 310 may extend from the short sides 300s of the thermal radiation film 300 toward the short lateral surfaces 200s of the semiconductor chip 200.

The thermal radiation film 300 may be formed of a plurality of layers. For example, the thermal radiation film 300 may include an adhesion layer 320, a thermal conduction layer 330, and a protection layer 340 that are sequentially stacked.

The adhesion layer 320 may be in contact with a top surface of the surface dielectric layer 600 and a top surface of the semiconductor chip 200. Alternatively, when the surface dielectric layer 600 is not provided in the base film 101, the adhesion layer 320 may be in contact with a top surface of the lead frames and/or a top surface of the circuit substrate 100. The adhesion layer 320 may be provided to attach the thermal radiation film 300 to the base film 101. For example, the adhesion layer 320 may be attached to the top surface of the surface dielectric layer 600 and the top surface of the semiconductor chip 200. The adhesion layer 320 may be provided in the form of an adhesive film or thin layer. For example, the adhesion layer 320 may include or be formed of an adhesive polymer. For another example, the adhesion layer 320 may include or be formed of a material of which thermal conductivity is high or in which particles having high thermal conductivity are dispersed. The adhesion layer 320 may include or be formed of, for example, a pressure sensitive adhesive (PSA). The adhesion layer 320 may have a thickness of about 1 μm to about 10 μm.

The thermal conduction layer 330 may be attached through the adhesion layer 320 to the top surface of the surface dielectric layer 600 and the top surface of the semiconductor chip 200. The thermal conduction layer 330 may be provided to receive heat from the semiconductor chip 200 and to discharge the heat outwardly from a semiconductor package. The thermal conduction layer 330 may be formed of a metallic material, such as copper (Cu), aluminum (Al), or stainless steels, or formed of a non-metallic material with high thermal conductivity. The thermal conduction layer 330 may have a thickness of about 10 μm to about 50 μm.

The protection layer 340 may cover the thermal conduction layer 330. The protection layer 340 may be provided to protect the thermal conduction layer 330 and the semiconductor chip 200 inside the thermal radiation film 300. For example, the protection layer 340 may include or be formed of polyimide (PI). The protection layer 340 may have a thickness of about 10 μm to about 30 μm. Alternatively, the protection layer 340 may be formed of a metallic material, such as copper (Cu), aluminum (Al), or stainless steels. When the protection layer 340 and the thermal conduction layer 330 are formed of the same material, the protection layer 340 and the thermal conduction layer 330 may be provided as one metal layer.

No limitation is imposed on the material and thickness of each of the adhesion layer 320, the thermal conduction layer 330, and the protection layer 340. In certain embodiments, the adhesion layer 320, the thermal conduction layer 330, and the protection layer 340 may each be formed of various materials and may be provided to have various thicknesses.

The adhesion layer 320, the thermal conduction layer 330, and the protection layer 340 may have the same planar shape. The adhesion layer 320, the thermal conduction layer 330, and the protection layer 340 may completely vertically overlap each other. For example, as shown in FIG. 14, the adhesion layer 320, the thermal conduction layer 330, and the protection layer 340 may have respective sidewalls 320a, 330a, and 340a that are vertically aligned with each other. For example, the adhesion layer 320, the thermal conduction layer 330, and the protection layer 340 may have the same shape in a plan view.

Figure 15:
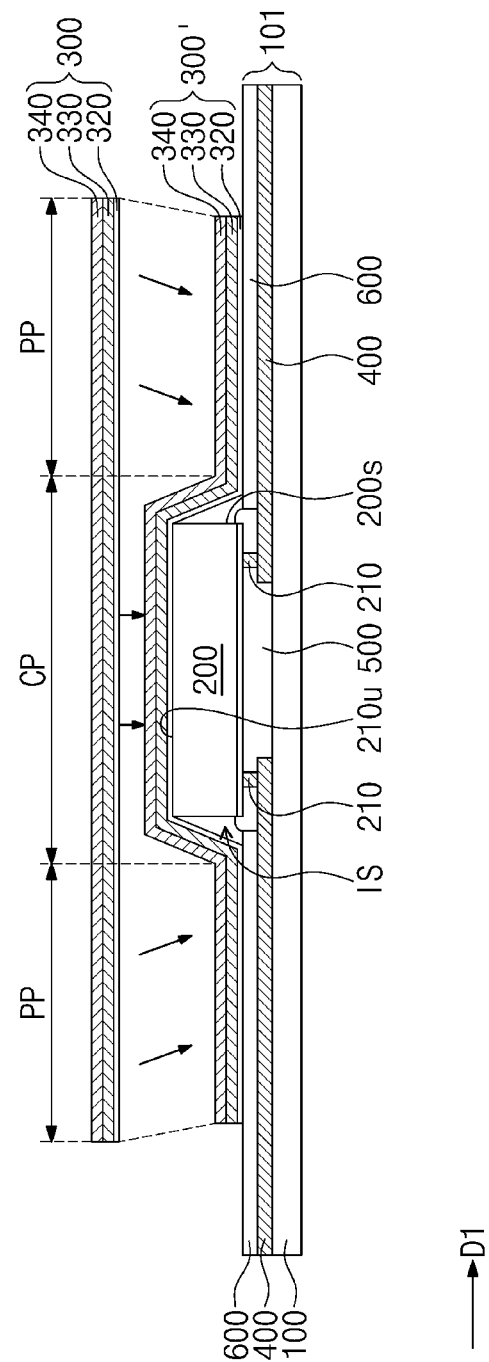
FIG. 15 illustrates a cross-sectional view showing a method of fabricating a semiconductor package according to some embodiments of the present inventive concepts.
Figure 16:
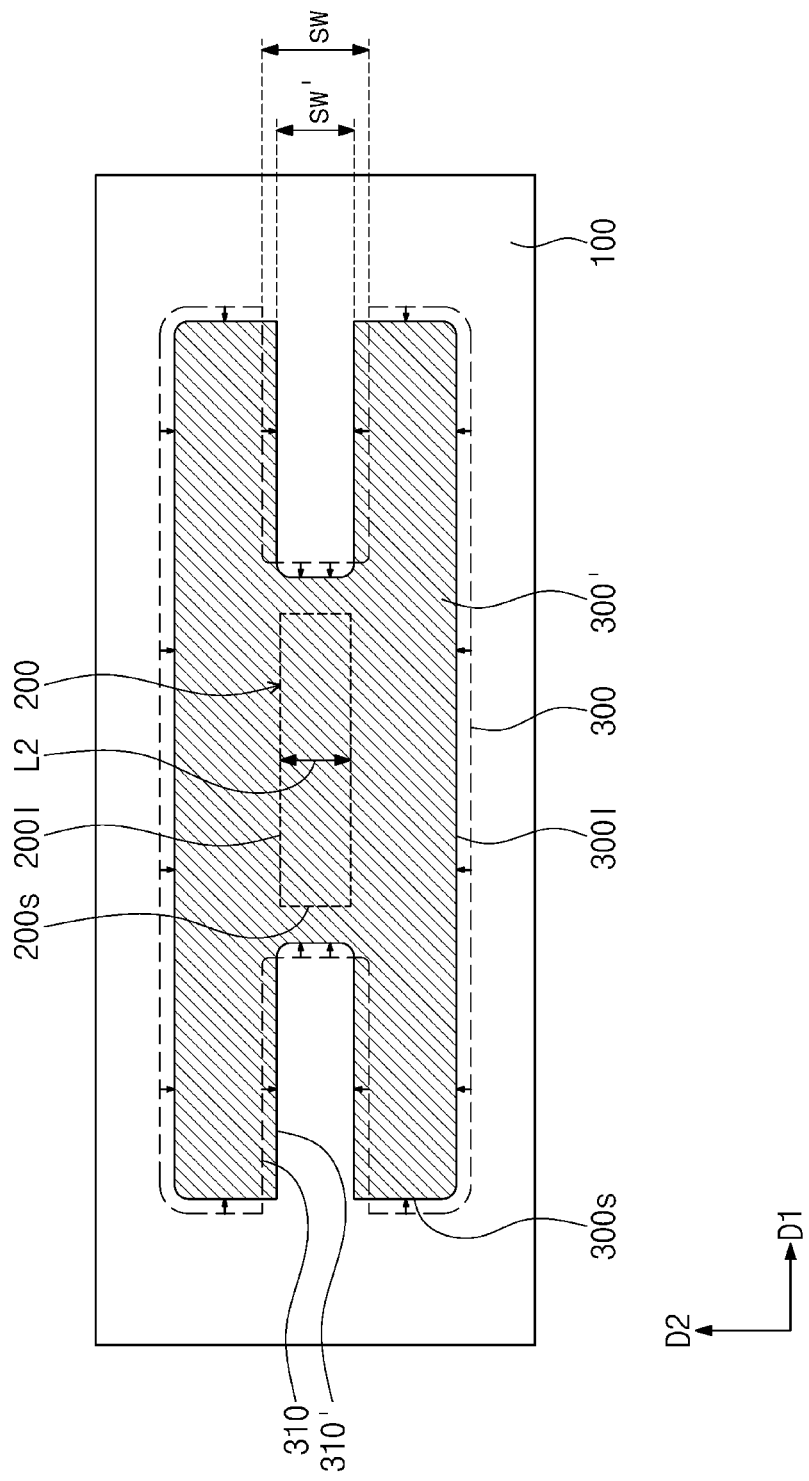
FIG. 16 illustrates a plan view showing a method of fabricating a semiconductor package according to some embodiments of the present inventive concepts.

FIG. 15 illustrates a cross-sectional view showing a method of fabricating a semiconductor package according to some embodiments of the present inventive concepts. FIG. 16 illustrates a plan view showing a method of fabricating a semiconductor package according to some embodiments of the present inventive concepts.

Referring to FIGS. 15 and 16, a base film 101 may be provided. The base film 101 may be the same as or similar to that discussed with reference to FIGS. 13 and 14. For example, the base film 101 may have the circuit substrate 100 and the lead frames 400 formed on the circuit substrate 100. The semiconductor chip 200 may be mounted on the base film 101.

The thermal radiation film 300 may be provided on the base film 101. Although not shown, the thermal radiation film 300 may be formed by forming a stack film by sequentially stacking the adhesion layer 320, the thermal conduction layer 330, and the protection layer 340, and then patterning the stack film A cutting process may be performed one time to process the stack film Therefore, the adhesion layer 320, the thermal conduction layer 330, and the protection layer 340 may be formed to have the same planar shape and to be vertically aligned with each other. When the cutting process is performed, the thermal radiation film 300 may be formed to have the slits 310. The thermal radiation film 300 may have the central part CP that covers the semiconductor chip 200 which will be discussed below and the peripheral part PP that surrounds the central part CP, and the slits 310 may be formed on the peripheral part PP. According to some embodiments of the present inventive concepts, the cutting process may be performed one time to form the thermal radiation film 300. For example, the thermal radiation film 300 may be formed by a simplified process, and a simplified method of fabricating a semiconductor package may be provided.

Afterwards, the thermal radiation film 300 may approach the base film 101 and then may be attached to the base film 101. For example, the thermal radiation film 300 may be aligned with the semiconductor chip 200 so as to allow the slits 310 of the thermal radiation film 300 to face the short lateral surfaces 200s of the semiconductor chip 200, and the slits 310 may have their slit widths sw each of which may be greater than the second length L2 of the short lateral surfaces 200s of the semiconductor chip 200. In this case, because the semiconductor chip 200 protrudes beyond a top surface of the base film 101, the thermal radiation film 300 may be attached to the top surface of the semiconductor chip 200 rather than to the top surface 200u of the base film 101, e.g., in the area where the semiconductor chip 200 is disposed.

Thereafter, while the thermal radiation film 300 continuously approaches the base film 101, as designated by arrows shown in FIGS. 15 and 16, a thermal radiation film 300' may be partially deformed. In this description, an apostrophe is added to a thermal radiation film and its components after attachment. The thermal radiation film 300' may overlap the entirety of the semiconductor chip 200. For example, the central part CP of the thermal radiation film 300' may cover all of the top surface 200u and the lateral surfaces 200s and 200l of the semiconductor chip 200. In a plan view, the deformation mentioned above may reduce a planar area of the thermal radiation film 300' and may also reduce the slit widths sw' of the slits 310' of the thermal radiation film 300'. For example, after the deformation of the thermal radiation film 300', the slit widths sw' of the slits 310' of the thermal radiation film 300' may be about 0.8 times to about 2 times the second length L2 of the short lateral surfaces 200s of the semiconductor chip 200.

While the thermal radiation film 300' continuously approaches the base film 101, the peripheral part PP of the thermal radiation film 300' may be attached to the base film 101. While the peripheral part PP of the thermal radiation film 300' is attached to the base film 101, the semiconductor chip 200 may be positioned in the internal space IS that is hermetically sealed by the base film 101 and the central part CP of the thermal radiation film 300'.

As for a semiconductor package according to some embodiments of the present inventive concepts, slits may be formed adjacent to short lateral surfaces of a semiconductor chip, and thus it may be possible to effectively relieve a stress applied to a thermal radiation film in the vicinity of the short lateral surfaces of the semiconductor chip. As a result, the semiconductor package may be provided to have increased structural stability.

In addition, the slits may have their small widths and may occupy small areas. Thus, it may be possible to increase a thermal radiation area of the thermal radiation film and a contact area between the thermal radiation film and a circuit substrate. Therefore, the thermal radiation film may relieve a stress that occurs when the semiconductor package is deformed, and also may increase thermal radiation efficiency and adhesion to the circuit substrate. Accordingly, the semiconductor package may be provided to have increased structural stability and improved thermal radiation efficiency.

In addition, the semiconductor chip may be completely covered with the thermal radiation film Thus, there may be an improvement in heat transfer from the semiconductor chip to the thermal radiation film Furthermore, there may be a uniformity of heat transfer to the thermal radiation film in accordance with the position of the semiconductor chip, and thus the semiconductor chip may have no temperature gradient therein, with the result that the semiconductor chip may be less damaged due to heat. Moreover, the thermal radiation film that surrounds the entirety of the semiconductor chip may have an electromagnetic shielding effect.

In a method of fabricating a semiconductor package according to some embodiments of the present inventive concepts, a cutting process may be performed one time to form the thermal radiation film For example, only one cutting process may complete the formation of the thermal radiation film Accordingly, the thermal radiation film may be formed by a simplified process, and a simplified method of fabricating a semiconductor package may be provided.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
    a circuit substrate;
    a semiconductor chip mounted on the circuit substrate; and
    a thermal radiation film covering the semiconductor chip on the circuit substrate,
    wherein the semiconductor chip includes:
    first lateral surfaces that are opposite to each other in a first direction; and
    second lateral surfaces that are opposite to each other in a second direction that intersects the first direction,
    wherein a first width of the first lateral surfaces is less than a second width of the second lateral surfaces,
    wherein the thermal radiation film covers a top surface of the semiconductor chip and covers the first lateral surfaces and the second lateral surfaces of the semiconductor chip, and
    wherein the thermal radiation film has a plurality of slits that are directed toward the first lateral surfaces from ends of the thermal radiation film.

2. The semiconductor package of claim 1, wherein the thermal radiation film includes:
    first ends that are opposite to each other in the first direction; and
    second ends that are opposite to each other in the second direction,
    wherein each of the slits extends from one of the first ends toward a facing one of the first lateral surfaces.

3. The semiconductor package of claim 2, wherein the slits have linear shapes that extend from the first ends toward the first lateral surfaces.

4. The semiconductor package of claim 2, wherein a width of the slit increases in a direction receding from the one of the first ends and approaching the facing one of the first lateral surfaces.

5. The semiconductor package of claim 1, wherein the semiconductor chip is hermetically sealed by the thermal radiation film and the circuit substrate.

6. The semiconductor package of claim 1, wherein a distance between an end of each of the slits of the thermal radiation film and a facing one of the first lateral surfaces of the semiconductor chip is about 1% to about 20% of the second width of the second lateral surfaces of the semiconductor chip.

7. The semiconductor package of claim 1, wherein the thermal radiation film includes:
    an adhesion layer attached to a top surface of the circuit substrate and the top surface of the semiconductor chip;
    a thermal conduction layer on the adhesion layer; and
    a protection layer on the thermal conduction layer,
    wherein a shape of the adhesion layer, a shape of the thermal conduction layer, and a shape of the protection layer are substantially the same in a plan view, and
    wherein the adhesion layer, the thermal conduction layer, and the protection layer are vertically aligned with each other.

8. The semiconductor package of claim 1, wherein at least two slits are on each of the first lateral surfaces,
    wherein the at least two slits are spaced apart from each other in the second direction.

9. The semiconductor package of claim 1, wherein
    the thermal radiation film has a rectangular shape in a plan view, and
    the slits extend toward the semiconductor chip from short sides of the thermal radiation film.

10. The semiconductor package of claim 1, wherein the thermal radiation film is attached to the top surface of the circuit substrate at an area that entirely surrounds the semiconductor chip.

11. The semiconductor package of claim 1, wherein the thermal radiation film is in contact with the first lateral surfaces and the second lateral surfaces.

12. The semiconductor package of claim 1, wherein a portion of the thermal radiation film adjacent to the first lateral surfaces is attached to the circuit substrate.

13. A semiconductor package, comprising:
a base film;
a semiconductor chip on the base film, the semiconductor chip having a short lateral surface and a long lateral surface which has a width greater than a width of the short lateral surface; and
a thermal radiation film covering the semiconductor chip on the base film,
wherein the thermal radiation film includes:
a central part that overlaps an entirety of the semiconductor chip; and
a peripheral part that surrounds the central part and is attached to the base film,
wherein the thermal radiation film has a slit on the peripheral part and adjacent to the short lateral surface of the semiconductor chip,
wherein the thermal radiation film includes:
an adhesion layer;
a thermal conduction layer on the adhesion layer; and
a protection layer on the thermal conduction layer,
wherein a shape of the adhesion layer, a shape of the thermal conduction layer, and a shape of the protection layer in a plan view are substantially the same, and
the thermal radiation film covers an entirety of each of a top surface of the semiconductor chip, the short lateral surfaces of the semiconductor chip, and the long lateral surfaces of the semiconductor chip.

14. The semiconductor package of claim 13, wherein, in a plan view, the slit has one of a linear shape and a rectangular shape that extend from an end of the thermal radiation film toward the short lateral surface of the semiconductor chip.

15. The semiconductor package of claim 13, wherein, in a plan view, the slit has a shape whose width increases in a direction receding from an end of the thermal radiation film and approaching the short lateral surface of the semiconductor chip.

16. The semiconductor package of claim 13, wherein
the semiconductor chip includes a pair of short lateral surfaces, and the pair of short lateral surfaces are opposite to each other in a first direction, and
the thermal radiation film includes a pair of slits, and each of the pair of slits is provided on one of the short lateral surfaces of the semiconductor chip.

17. The semiconductor package of claim 13, wherein the base film and the central part of the thermal radiation film provide a hermetically sealed space in which the semiconductor chip is accommodated.

18. The semiconductor package of claim 13, wherein a distance between an end of the slit of the thermal radiation film and the short lateral surface of the semiconductor chip is in a range of about 1% to about 20% of the width of the long lateral surface of the semiconductor chip.

19. The semiconductor package of claim 13, wherein a width of the slit is about 0.8 times to about 2 times the width of the short lateral surface of the semiconductor chip.

20. The semiconductor package of claim 13, wherein
a plurality of slits are provided in the thermal radiation film,
the plurality of slits extend in a first direction from an end of the thermal radiation film toward the short lateral surface of the semiconductor chip, and
the plurality of slits are spaced apart from each other in a second direction that intersects the first direction.

* * * * *